(12) United States Patent
Park et al.

(10) Patent No.: US 8,755,152 B1
(45) Date of Patent: Jun. 17, 2014

(54) METHOD AND SYSTEM FOR PROVIDING AN IMPROVED SENSOR STACK FOR A RECORDING HEAD

(75) Inventors: Chando Park, Palo Alto, CA (US); Qunwen Leng, Palo Alto, CA (US); Min Zhou, Fremont, CA (US); Sangmun Oh, Fremont, CA (US); Mahendra Pakala, Fremont, CA (US)

(73) Assignee: Western Digital (Fremont), LLC, Fremont, CA (US)

(*) Notice: Subject to any disclaimer, the term of this patent is extended or adjusted under 35 U.S.C. 154(b) by 1144 days.

(21) Appl. No.: 12/236,833

(22) Filed: Sep. 24, 2008

(51) Int. Cl.
*G11B 5/39* (2006.01)

(52) U.S. Cl.
USPC ...... 360/319; 360/324.11; 428/811; 428/815; 428/816

(58) Field of Classification Search
None
See application file for complete search history.

(56) References Cited

U.S. PATENT DOCUMENTS

| | | | |
|---|---|---|---|
| 4,755,897 A | 7/1988 | Howard | |
| 6,222,707 B1 | 4/2001 | Huai et al. | |
| 6,767,655 B2 | 7/2004 | Hiramoto et al. | |
| 6,778,363 B2 | 8/2004 | Meguro et al. | |
| 6,819,532 B2 | 11/2004 | Kamijo | |
| 7,089,648 B2 | 8/2006 | Meguro et al. | |
| 7,092,222 B2 | 8/2006 | Hasegawa et al. | |
| 7,170,725 B1* | 1/2007 | Zhou et al. | 360/324.11 |
| 7,310,207 B2 | 12/2007 | Hasegawa et al. | |
| 2007/0146928 A1 | 6/2007 | Zhang et al. | |
| 2007/0297100 A1* | 12/2007 | Miyajima et al. | 360/324.11 |
| 2008/0062557 A1* | 3/2008 | Tsuchiya et al. | 360/86 |
| 2009/0251829 A1* | 10/2009 | Zhang et al. | 360/319 |

OTHER PUBLICATIONS

Pakala et al., "Effect of underlayer roughness, grain size, and crystal texture on exchange coupled IrMn/CoFe thin films", J. Appl. Phys., vol. 87, No. 9, May 1, 2000, pp. 6653.

Lee et al., "Exchange biasing field of NiFe/[IrMn—Mn]/CoFe multilayers depending on Mn content", J. Appl. Phys., vol. 95, No. 11, Part 2, Jun. 1, 2004, pp. 7525-7527.

Furjanic et al., "The Effects of Ruthenium and Grain Size on Spin Valves With Ultra Thin Antiferromagnetic Pinning Layers", IEEE Transactions on Magnetics, vol. 43, No. 6, Jun. 2007, pp. 2845-2847.

* cited by examiner

*Primary Examiner* — Kevin Bernatz

(57) ABSTRACT

A method and system for providing a magnetic transducer is described. The method and system include providing a magnetic shield, an insertion layer on the magnetic shield, an antiferromagnetic (AFM) layer, a pinned layer magnetically coupled with the AFM layer, a nonmagnetic spacer layer, and a free layer. The magnetic shield has a texture and a grain size. The insertion layer has a thickness that is sufficiently large that the AFM layer is magnetically decoupled from the magnetic shield and sufficiently small that the AFM layer is structurally coupled with the magnetic shield. The pinned layer resides between the AFM layer and the nonmagnetic spacer layer. The nonmagnetic spacer layer resides between the free layer and the pinned layer.

33 Claims, 4 Drawing Sheets

METHOD AND SYSTEM FOR PROVIDING AN IMPROVED SENSOR STACK FOR A RECORDING HEAD

BACKGROUND

FIG. 1 depicts a side view of a conventional magnetic read transducer 10 used in reading a media (not shown). The conventional read transducer 10 includes conventional shields 12 and 30 and read sensor 18. The conventional shields 12 and 30 are typically formed of a soft magnetic material, such as NiFe. On the conventional shield 12 is a nonmagnetic layer 14 including materials such as Ta or Cu. This conventional nonmagnetic layer 14 typically is between fifteen and fifty Angstroms in thickness. On the conventional nonmagnetic layer 14 is a conventional seed layer 16. The conventional seed layer 16 typically includes materials such as Ru, NiFeCr, NiFe, or CoFe. The conventional sensor includes a conventional AFM layer 20, a conventional pinned layer 22, a conventional barrier or spacer layer 24, and a conventional free layer 26. Also shown is a conventional capping layer 28 that resides between the conventional free layer 28 and the conventional second shield 30. The conventional AFM layer 20 is typically seventy to eighty Angstroms, or more, in thickness and is used to pin, or fix the direction of, the magnetization of the conventional pinned layer 22. A minimum thickness of the conventional AFM layer 20 is desired in order to provide sufficient thermal stability and to sufficiently pin the magnetization of the conventional pinned layer 22. Materials such as IrMn and PtMn may be used for the conventional AFM layer. The conventional pinned layer 22 may be a synthetic antiferromagnetic (SAF) layer including ferromagnetic layers that are separated by a nonmagnetic spacer layer. The conventional barrier/spacer layer 24 may be an insulating barrier layer or a conductive layer. Thus, the conventional sensor 18 may be a magnetic tunneling junction or a spin valve.

Although the conventional read transducer 10 functions, the trend in hard disk drives is toward a smaller shield-to-shield spacing. This shield-to-shield spacing is the distance, t, between the shields 12 and 30. However, improved thermal stability of the conventional sensor 18 as well as a higher magnetoresistive effect for the sensor 18 are still desired.

Accordingly, what is needed is a system and method for reducing the shield-to-shield spacing while maintaining sufficient performance of the conventional sensor 18.

BRIEF SUMMARY OF THE INVENTION

A method and system for providing a magnetic transducer is described. The method and system include providing a magnetic shield, an insertion layer on the magnetic shield, an antiferromagnetic (AFM) layer, a pinned layer magnetically coupled with the AFM layer, a nonmagnetic spacer layer, and a free layer. The magnetic shield has a texture and a grain size. The insertion layer has a thickness that is sufficiently large that the AFM layer is magnetically decoupled from the magnetic shield and sufficiently small that the AFM layer is structurally coupled with the magnetic shield. The pinned layer resides between the AFM layer and the nonmagnetic spacer layer. The nonmagnetic spacer layer resides between the free layer and the pinned layer.

DETAILED DESCRIPTION OF THE PREFERRED EMBODIMENTS

Figure 1:
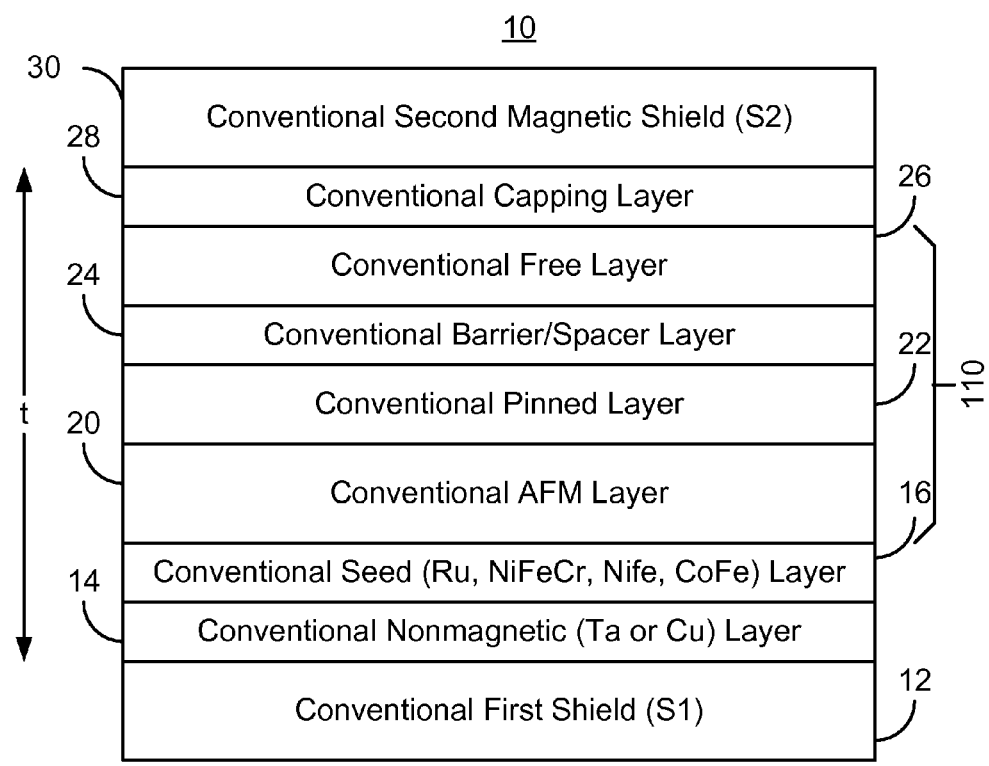
FIG. 1 is a diagram of a conventional read transducer.
Figure 2:
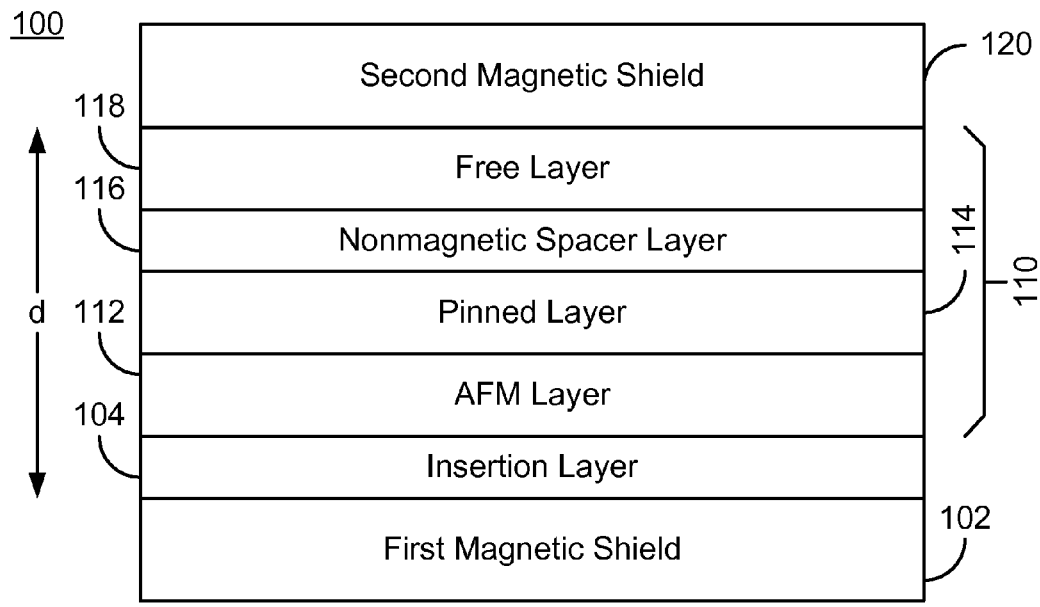
FIG. 2 is a diagram of an exemplary embodiment of a magnetic transducer.

FIG. 2 is a diagram of an exemplary embodiment of a magnetic transducer 100. The magnetic transducer 100 is a read transducer may be part of a merged head that also includes a write transducer (not shown) and resides on a slider (not shown). The magnetic transducer 100 may also include other structures, such as hard bias structures for the sensor that are not shown.

The magnetic transducer 100 includes a first magnetic shield 102, an insertion layer 104, a sensor 110, and a second shield 120. The sensor 110 includes an antiferromagnetic (AFM) layer 112, a pinned layer 114, a nonmagnetic spacer layer 116, and a free layer 118. The magnetic shield 102 may be composed of a high permeability, soft material, such as NiFe. The first magnetic shield 102 is thick, typically at least five hundred nanometers through two micrometers. The magnetic shield 102 has a texture and a grain size. In one embodiment, the NiFe has a (111) texture. In addition, the grain size may be large. The grain size for a layer is a measure of the average diameter of grains in the layer. In some embodiments, the grain size for the magnetic shield 102 may be thirty through fifty nanometers or larger.

The insertion layer 104 resides on the magnetic shield 102. In one embodiment, the insertion layer 104 adjoins the magnetic shield 102 and the AFM layer 112 of the sensor 110. The insertion layer 104 has a thickness that is sufficiently large that the AFM layer 112 is magnetically decoupled from the magnetic shield 102 and sufficiently small that the AFM layer 112 is structurally coupled with the magnetic shield 102. In one embodiment, the insertion layer 104 has a thickness of at least two and not more than twenty-five Angstroms. In one such embodiment, the insertion layer 104 has a thickness of at least seven and not more than ten Angstroms. In addition, in order to magnetically decouple the AFM layer 112 from the magnetic shield 102, the insertion layer 104 may be nonmagnetic. To aid in ensuring that the AFM layer 112 and the magnetic shield 102 are structurally coupled, the insertion layer 104 may have a face-centered cubic (fcc) or hexagonal close packed (hcp) structure. Further, it may be desirable for the insertion layer 104 to have a high melting point. For example, materials such as Ru, Cu, Rh, Pt, and/or NiFeCr may be used for the insertion layer 104. Such materials are fcc (NiFeCr, Pt, Cu) or hcp (Ru).

The AFM layer 112 resides on the insertion layer 104. The insertion layer 104 may thus be considered as part of seed layer for the AFM layer 112, or may be considered an adhesion layer for the AFM layer 112. The AFM layer 112 may include materials such as IrMn, IrMnCr, and PtMn. The AFM layer 112 is also structurally coupled with the magnetic shield 102. As a result, the grain size of the AFM layer 112 may correspond to the grain size of the magnetic shield 102. Similarly, the texture of the AFM layer 112 may correspond to the texture of the magnetic shield 102. For example, the AFM layer 112 may have an increased grain size for a given thickness of the AFM layer 112. Furthermore, the texture of the AFM layer 112 may also be coupled with that of the magnetic shield 102. Thus, the AFM layer 112 may have a (111) texture. The AFM layer 112 may have a reduced thickness. For example, AFM layer 112 may have a thickness of not more than seventy Angstroms. In another embodiment, the thickness of the AFM layer 112 is not more than fifty Angstroms. In one such embodiment, the thickness of the AFM layer 112 is not less than twenty Angstroms.

The pinned 114 is layer magnetically coupled with the AFM layer 112. In one embodiment, the pinned layer 114 may be a synthetic antiferromagnetic (SAF) layer. In another embodiment, the pinned layer 114 may be a simple ferromagnetic layer. The nonmagnetic spacer layer 116 may be an insulating barrier layer, such as MgO or alumina, may be a conductive layer, or may have another structure. The free layer has a magnetization that responds to the magnetic field of a media (not shown in FIG. 2). Although not shown, the free layer 118 may include multiple sublayers.

Use of the magnetic shield 102 in combination with the insertion layer 104 and AFM layer 112 may allow the magnetic transducer 100 to have a lower shield-to-shield spacing, d. The AFM layer 112 is structurally coupled with the magnetic shield 102. In other words, the magnetic shield 102 may act as a seed layer for the AFM layer 112. Because the AFM layer 112 is structurally coupled with the magnetic layer 102, the AFM layer may have increased grain size. Further, the texture of the AFM layer 112 may be coupled with the texture of the magnetic shield 102. As a result, an AFM layer 112 having the desired crystal structure may be achieved. In particular, the AFM layer 112 may have the desired structure at a lower thickness. Because of the presence of the insertion layer 104, the AFM layer 112 does not physically contact and is, therefore, magnetically decoupled from the magnetic shield 102. Consequently, the AFM layer 112 may have the desired structure and magnetic properties at lower thickness. For example, in one embodiment, an AFM layer 112 having a thickness as low as fifty Angstroms may function as desired. All other features being equal, the shield-to-shield spacing, d, of the magnetic transducer, 100 may be less than the conventional shield-to-shield spacing, t, of the conventional transducer 100. Further, the insertion layer 104 may be less than the combined thickness of the conventional nonmagnetic layer 14 and conventional seed layer 16. Thus, the shield-to-shield spacing, d, may be further reduced without adversely affecting properties of the magnetic transducer 100, such as the thermal stability of the sensor 110. Consequently, the magnetic transducer 100 may be used in higher density recording.

Figure 3:
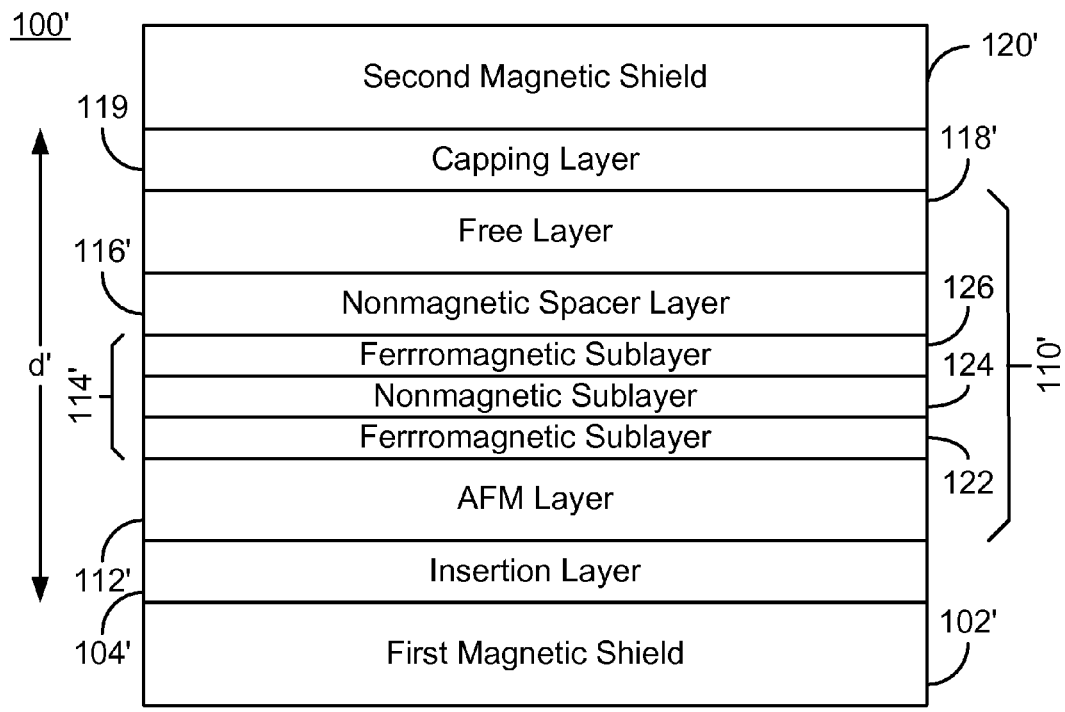
FIG. 3 depicts another exemplary embodiment of a magnetic transducer.

FIG. 3 depicts another exemplary embodiment of a magnetic transducer 100'. The magnetic transducer 100' is a read transducer may be part of a merged head that also includes a write transducer (not shown) and resides on a slider (not shown). The magnetic transducer 100' may also include other structures, such as hard bias structures for the sensor that are not shown. The magnetic transducer 100' is analogous to the magnetic transducer 100. Consequently, analogous structures are similarly labeled. The magnetic transducer 100' thus includes a first magnetic shield 102', an insertion layer 104', and a sensor 110', a capping layer 119, and a second shield 120'. The sensor 110' includes AFM layer 112', pinned layer 114', a nonmagnetic spacer layer 116', and a free layer 118'.

The magnetic shield 102' is analogous to the magnetic shield 102 and thus may be composed of a high permeability, soft material, such as NiFe. The first magnetic shield 102 is thick, typically at least five hundred nanometers through two micrometers. The magnetic shield 102 has a texture and a grain size. In one embodiment, the NiFe has a (111) texture. In addition, the grain size may be large. In some embodiments, the grain size for the magnetic shield 102' may be thirty through fifty nanometers or larger.

The insertion layer 104' resides on the magnetic shield 102'. In one embodiment, the insertion layer 104' adjoins the magnetic shield 102' and the AFM layer 112' of the sensor 110'. The insertion layer 104' has a thickness that is sufficiently large that the AFM layer 112' is magnetically decoupled from the magnetic shield 102' and sufficiently small that the AFM layer 112' is structurally coupled with the magnetic shield 102'. In one embodiment, the insertion layer 104' has a thickness of at least two and not more than twenty-five Angstroms. In one such embodiment, the insertion layer 104' has a thickness of at least seven and not more than ten Angstroms. The insertion layer 104' is nonmagnetic. To aid in ensuring that the AFM layer 112' and the magnetic shield 102' are structurally coupled, the insertion layer 104' may have a fcc or hcp structure. Further, it may be desirable for the insertion layer 104' to have a high melting point. For example, materials such as Ru, Cu, Rh, Pt, and/or NiFeCr may be used for the insertion layer 104'.

The AFM layer 112' resides on the insertion layer 104'. The AFM layer 112' may include materials such as IrMn, IrMnCr, and PtMn. Because of the insertion layer 104', the AFM layer 112' is structurally coupled with and magnetically decoupled from the magnetic shield 102'. As a result, the grain size of the AFM layer 112' may correspond to the grain size of the magnetic shield 102'. Similarly, the texture of the AFM layer 112' may correspond to the texture of the magnetic shield 102'. For example, the AFM layer 112' may have an increased grain size for a given thickness of the AFM layer. Furthermore, the texture of the AFM layer 112' may also be coupled with that of the magnetic shield 102'. Thus, the AFM layer 112' may have a (111) texture. The AFM layer 112' may have a reduced thickness. For example, AFM layer 112' may have a thickness of not more than seventy Angstroms. In another embodiment, the thickness of the AFM layer 112' is not more than fifty Angstroms. In one such embodiment, the thickness of the AFM layer 112' is not less than twenty Angstroms.

The pinned 114' is layer magnetically coupled with the AFM layer 112'. In the embodiment shown, the pinned layer 114' is a SAF layer including sublayers 122, 124, and 126. The layers 122 and 124 are ferromagnetic sublayers separated by a nonmagnetic sublayer 124. The ferromagnetic sublayers 122 and 124 may be antiferromagnetically coupled through the nonmagnetic layer 124. The nonmagnetic spacer layer 116' may be an insulating barrier layer, such as MgO or alumina, may be a conductive layer, or may have another structure. The free layer has a magnetization that responds to the magnetic field of a media (not shown in FIG. 3). Although not shown, the free layer 118' may include multiple sublayers.

The magnetic transducer 100' has analogous benefits to the magnetic transducer 100. In particular, the AFM layer 112' may be thinner while retaining the desired grain size and, in at least some embodiments, texture. Further, the thickness of the insertion layer 104' may be less than the combined thickness of the conventional nonmagnetic layer 14' and conventional seed layer 16'. Thus, the shield-to-shield spacing, d', may be further reduced without adversely affecting properties of the magnetic transducer 100, such as the thermal stability of the sensor 110. Consequently, the magnetic transducer 100 may be used at higher density recording.

Figure 4:
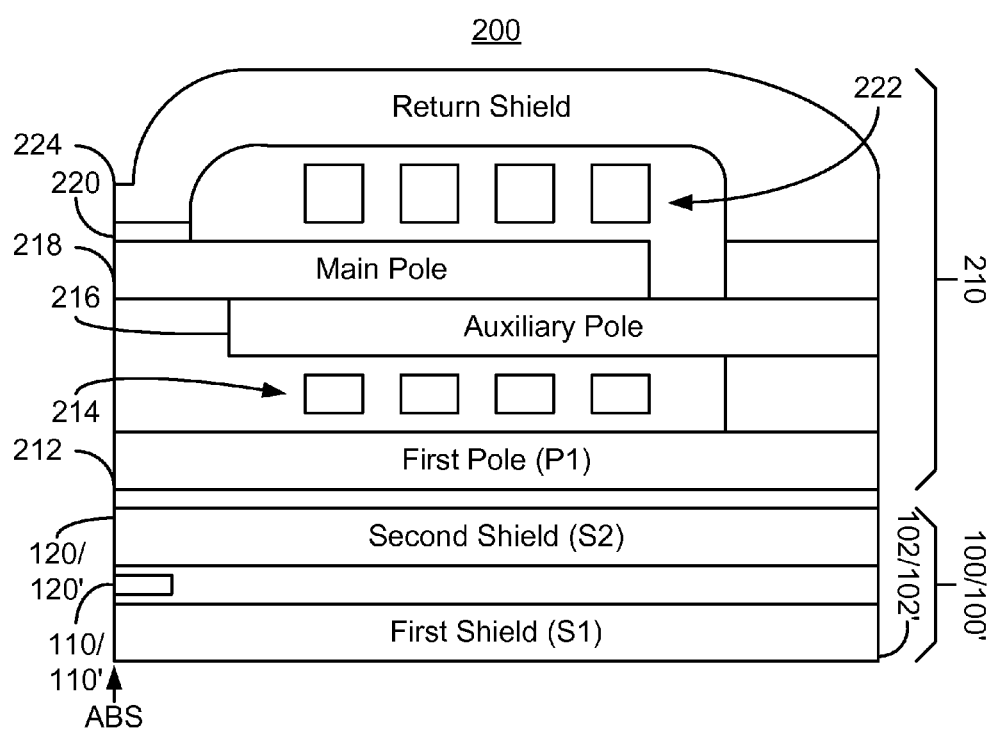
FIG. 4 depicts an exemplary embodiment of a magnetic recording head.

FIG. 4 depicts an exemplary embodiment of a magnetic recording head 200 used in recording to and reading from a media (not shown). The magnetic recording head 200 includes a read transducer 100/100' and a write transducer 210. The conventional write transducer 210 may be a perpendicular magnetic recording (PMR) transducer or a longitudinal magnetic recording transducer. The conventional read transducer 100/100' includes shields 102/102' and 120/120' and read sensor 110/110'. The write transducer 210 includes a first pole 212 that may be merged with shield 120/120', a first coil 214, an auxiliary pole 216, a main pole 218, write gap 220, a second coil 222, and a return shield 224.

The magnetic head 200 shares the benefits of the magnetic transducers 100/100'. Thus, the shield-to-shield spacing between the shields 102/102' and the shield 120/120' may be reduced. The magnetic recording head 200 may, therefore, be suitable for higher density recording head.

Figure 5:
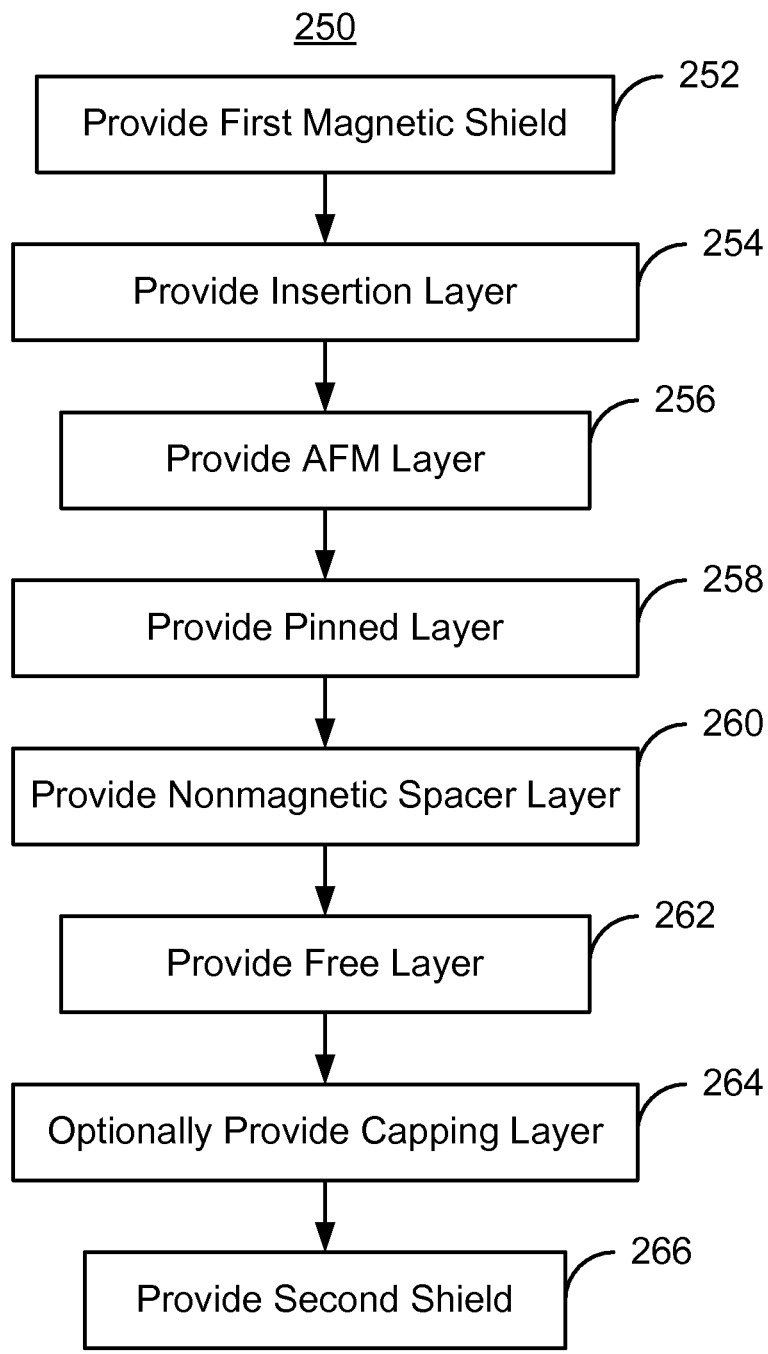
FIG. 5 is a flow chart of an exemplary embodiment of a method for fabricating a magnetic transducer.

FIG. 5 is a flow chart of an exemplary embodiment of a method 250 for a magnetic transducer, such as the magnetic transducer 100/100'. For simplicity, some steps may be omitted or combined. The method 250 also may commence after formation of other structures of the read and/or write transducer. The method 250 is also described in the context of providing a single magnetic transducer. However, the method 250 may be used to fabricate multiple structures at substantially the same time. The method 250 is also described in the context of particular layers. However, in some embodiments, such layers may include sub-layer(s).

The magnetic shield 102/102' that has a texture and a shield grain size is provided, via step 252. In one embodiment, step 252 includes providing the shield 102/102' as well as etching the surface of the magnetic shield 102/102' to remove any native oxide or contamination. In one embodiment, the grain size of the shield 102/102' is at least thirty nanometers through fifty nanometers. In one such embodiment, the magnetic shield 102/102' also has a texture. For example, the texture may be (111).

The insertion layer 104/104' is provided on the magnetic shield 102/102', via step 254. In one embodiment, step 254 includes depositing the insertion layer 104/104', for example by sputtering. The insertion layer 104/104' may be nonmagnetic and thin. In one embodiment, the insertion layer is at least two and not more than twenty-five Angstroms. In another embodiment, step 254 includes depositing the insertion layer 104/104' having a thickness of at least seven and not more than ten Angstroms.

The AFM layer 112/112' is provided on the insertion layer 104/104', via step 256. Step 256 may include providing an AFM layer having a thickness of not more than seventy Angstroms. In addition, the AFM layer 112/112' is structurally coupled and magnetically decoupled from the magnetic shield 102/102'.

A pinned layer 114/114' that is magnetically coupled with the AFM layer 112/112' is provided, via step 258. In one embodiment, step 258 includes providing a SAF layer. In such an embodiment, step 258 includes depositing ferromagnetic sublayers separated by a nonmagnetic layer.

A nonmagnetic spacer layer 116/116' is provided on the pinned layer 114/114', via step 260. Step 260 may include depositing an insulating barrier layer, a conductive layer, or other layer. The free layer 118/118' is also provided, via step 262. The capping layer 119 is optionally provided, via step 264. The second shield 120/120' may then be deposited, via step 266. Fabrication of the magnetic head 200 may then be completed. For example, anneals, deposition of other materials and/or other processes may be used to complete the magnetic recording head 100/100'.

Using the method 250, the magnetic head 200 may be provided. The magnetic head 200 shares the benefits of the magnetic transducers 100/100'. Thus, the shield-to-shield spacing between the shields 102/102' and the shield 120/120' may be reduced. The magnetic recording head 200 may, therefore, be suitable for higher density recording head.

We claim:

1. A magnetic transducer comprising:
   a magnetic shield consisting of a single layer having a shield crystallographic structure including a texture and a grain size;
   an insertion layer on and sharing a first interface with the magnetic shield, the insertion layer having a thickness;
   an antiferromagnetic (AFM) layer having an AFM crystallographic structure, an AFM texture, and residing on the insertion layer, the AFM layer sharing a second interface with the insertion layer, the thickness of the insertion layer being sufficiently large that the AFM layer is magnetically decoupled from the magnetic shield and sufficiently small that the AFM crystallographic structure of the AFM layer is structurally coupled with the shield crystallographic structure of the magnetic shield, the AFM texture corresponding to and being the same as the texture;
   a pinned layer magnetically coupled with the AFM layer;
   a nonmagnetic spacer layer, the pinned layer residing between the AFM layer and the nonmagnetic spacer layer;
   a free layer, the nonmagnetic spacer layer residing between the free layer and the pinned layer.

2. The magnetic transducer of claim 1 wherein the grain size of the magnetic shield is at least thirty nanometers.

3. The magnetic transducer of claim 2 wherein the grain size of the magnetic shield is not more than fifty nanometers.

4. The magnetic transducer of claim 2 wherein the AFM layer has an AFM grain size, the AFM grain size corresponding to the grain size of the magnetic shield.

5. The magnetic transducer of claim 1 wherein the texture is (111).

6. The magnetic transducer of claim 5 wherein the AFM texture is (111).

7. The magnetic transducer of claim 1 wherein the thickness of the insertion layer is at least two Angstroms and not more than twenty-five Angstroms.

8. The magnetic transducer of claim 7 wherein the thickness of the insertion layer is at least seven and not more than ten Angstroms.

9. The magnetic transducer of claim 1 wherein the insertion layer includes at least one of Ru, Cu, Pt, and NiFeCr.

10. The magnetic transducer of claim 1 wherein the insertion layer is nonmagnetic.

11. The magnetic transducer of claim 1 wherein the insertion layer has at least one of a face-centered cubic and a hexagonal close packed crystal structure.

12. The magnetic transducer of claim 1 wherein the AFM layer has an AFM thickness of not more than seventy Angstroms.

13. The magnetic transducer of claim 12 wherein the AFM thickness is not more than fifty Angstroms.

14. The magnetic transducer of claim 12 wherein the AFM thickness is not less than twenty Angstroms.

15. The magnetic transducer of claim 1 wherein pinned layer is a synthetic antiferromagnetic layer including a first ferromagnetic sublayer, a second ferromagnetic sublayer, and a nonmagnetic sublayer between the first ferromagnetic sublayer and the second ferromagnetic sublayer.

16. The magnetic transducer of claim 1 wherein the AFM layer includes at least one of IrMn, PtMn, and IrMnCr.

17. A magnetic transducer comprising:
a magnetic shield consisting of a single layer having a (111) texture and a shield grain size of at least thirty nanometers;
an insertion layer on and sharing a first interface with the magnetic shield, the insertion layer being nonmagnetic, having at least one of a face-centered cubic and a hexagonal close packed crystal structure, and having a thickness of at least two and not more than ten Angstroms;
an antiferromagnetic (AFM) layer on the insertion layer and sharing a second interface with the insertion layer, the AFM layer having an AFM texture and an AFM grain size, the thickness of the insertion layer being sufficiently large that the AFM layer is magnetically decoupled from the magnetic shield and sufficiently small that a crystallographic structure of the AFM layer is structurally coupled with the magnetic shield such that the AFM texture is a (111) and the AFM grain size corresponds to the shield grain size, the AFM layer having a thickness of not more than seventy Angstroms;
a pinned layer magnetically coupled with the AFM layer, the pinned layer being a synthetic antiferromagnetic layer including a first ferromagnetic sublayer, a second ferromagnetic sublayer, and a nonmagnetic sublayer between the first ferromagnetic sublayer and the second ferromagnetic sublayer;
a nonmagnetic spacer layer, the synthetic pinned layer residing between the AFM layer and the nonmagnetic spacer layer;
a free layer, the nonmagnetic spacer layer residing between the free layer and the synthetic pinned layer.

18. A disk drive comprising:
a slider;
at least one magnetic transducer residing on the slider, the at least one magnetic transducer including a magnetic shield, an insertion layer, an antiferromagnetic (AFM) layer, a pinned layer, a nonmagnetic spacer layer, and a free layer, the magnetic shield consisting of a single layer having a shield crystallographic structure including a texture and a shield grain size, the insertion layer residing on the magnetic shield and sharing a first interface with the magnetic shield, the insertion layer having a thickness, the AFM layer having an AFM crystallographic structure, an AFM texture, and residing on the insertion layer, the AFM layer sharing a second interface with the insertion layer, the thickness of the insertion layer being sufficiently large that the AFM layer is magnetically decoupled from the magnetic shield and sufficiently small that the AFM crystallographic structure of the AFM layer is structurally coupled with the shield crystallographic structure of the magnetic shield, the AFM texture corresponding to and being the same as the texture, the pinned layer residing on and being magnetically coupled with the AFM layer; the pinned layer residing between the AFM layer and the nonmagnetic spacer layer, the nonmagnetic spacer layer residing between the free layer and the pinned layer.

19. A method for providing magnetic transducer comprising:
providing a magnetic shield consisting of a single layer having a shield crystallographic structure including a texture and a shield grain size;
providing an insertion layer on and sharing a first interface with the magnetic shield, the insertion layer having a thickness;
providing an antiferromagnetic (AFM) layer having an AFM crystallographic structure, an AFM texture, and residing on the insertion layer, the AFM layer sharing a second interface with the insertion layer, the thickness of the insertion layer being sufficiently large that the AFM layer is magnetically decoupled from the magnetic shield and sufficiently small that the AFM crystallographic structure of AFM layer is structurally coupled with the shield crystallographic structure of the magnetic shield, the AFM texture corresponding to and being the same as the texture;
providing a pinned layer magnetically coupled with the AFM layer;
providing a nonmagnetic spacer layer, the pinned layer residing between the AFM layer and the nonmagnetic spacer layer;
providing a free layer, the nonmagnetic spacer layer residing between the free layer and the pinned layer.

20. The method of claim 19 wherein the shield grain size is at least thirty nanometers.

21. The method of claim 20 wherein the AFM layer has an AFM grain size corresponding to the shield grain size.

22. The method of claim 19 wherein the texture is (111).

23. The method of claim 19 wherein the step of providing the insertion layer further includes:
providing the insertion layer having the thickness of least two Angstroms and not more than twenty-five Angstroms.

24. The method of claim 23 wherein the thickness of the insertion layer is at least seven and not more than ten Angstroms.

25. The method of claim 19 wherein the insertion layer includes at least one of Ru, Cu, Pt, and NiFeCr.

26. The method of claim 19 wherein the insertion layer is nonmagnetic.

27. The method of claim 19 wherein the AFM layer has an AFM thickness of not more than seventy Angstroms.

28. The method of claim 19 wherein the step of providing the pinned layer further includes:
providing a synthetic antiferromagnetic layer including a first ferromagnetic sublayer, a second ferromagnetic sublayer, and a nonmagnetic sublayer between the first ferromagnetic sublayer and the second ferromagnetic sublayer.

29. The method of claim 19 wherein the step of providing the AFM layer further includes:
providing a layer including at least one of IrMn, PtMn, and IrMnCr.

30. The magnetic transducer of claim 1 wherein the insertion layer consists of a single insertion layer.

31. The magnetic transducer of claim 17 wherein the insertion layer consists of a single insertion layer.

32. The disk drive of claim 18 wherein the insertion layer consists of a single insertion layer.

33. The method of claim 19 wherein the insertion layer consists of a single insertion layer.

* * * * *